United States Patent
Bonifield et al.

(10) Patent No.: US 9,408,302 B2
(45) Date of Patent: Aug. 2, 2016

(54) HIGH VOLTAGE POLYMER DIELECTRIC CAPACITOR ISOLATION DEVICE

(71) Applicant: Texas Instruments Incorporated, Dallas, TX (US)

(72) Inventors: Thomas Dyer Bonifield, Dallas, TX (US); Byron Williams, Plano, TX (US); Shrinivasan Jaganathan, Richardson, TX (US); David Larkin, Richardson, TX (US); Dhaval Atul Saraiya, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/643,230

(22) Filed: Mar. 10, 2015

(65) Prior Publication Data

US 2015/0181706 A1 Jun. 25, 2015

Related U.S. Application Data

(63) Continuation of application No. 13/960,406, filed on Aug. 6, 2013, now Pat. No. 9,006,584.

(51) Int. Cl.
*H05K 1/09* (2006.01)
*H05K 1/03* (2006.01)
(Continued)

(52) U.S. Cl.
CPC .............. *H05K 1/0346* (2013.01); *H01L 23/62* (2013.01); *H05K 1/0256* (2013.01); *H05K 1/0257* (2013.01); *H05K 1/0306* (2013.01); *H05K 1/09* (2013.01); *H05K 1/112* (2013.01); *H05K 1/162* (2013.01); *H05K 1/165* (2013.01); *H05K 3/0088* (2013.01); *H05K 3/4688* (2013.01); *H01L 2224/02166* (2013.01); *H01L 2224/05554* (2013.01); *H01L 2224/48227* (2013.01); *H01L 2224/48463* (2013.01); *H01L 2224/49171* (2013.01); *H01L 2224/49175* (2013.01); *H05K 1/0262* (2013.01); *H05K 2201/0154* (2013.01);
(Continued)

(58) Field of Classification Search
CPC ......... H01L 21/02; H01L 21/66; H01L 21/70; H01L 21/71; H01L 23/02; H01L 23/12; H01L 23/48; H01L 23/58; H01L 23/66; H01L 27/06; H01L 27/10
USPC ............ 174/257, 255, 258, 260, 261; 257/77, 257/296, 306, 522, 528, 620, 737, 760; 438/17, 381, 396, 623, 472
See application file for complete search history.

(56) References Cited

U.S. PATENT DOCUMENTS 5,310,965 A * 5/1994 Senba .................... H01L 23/057
174/250
5,455,459 A * 10/1995 Fillion ................ H01L 23/5389
174/262
(Continued)

*Primary Examiner* — Xiaoliang Chen
(74) *Attorney, Agent, or Firm* — Jacqueline J. Garner; Frank D. Cimino

(57) ABSTRACT

An electronic isolation device is formed on a monolithic substrate and includes a plurality of passive isolation components. The isolation components are formed in three metal levels. The first metal level is separated from the monolithic substrate by an inorganic PMD layer. The second metal level is separated from the first metal level by a layer of silicon dioxide. The third metal level is separated from the second metal level by at least 20 microns of polyimide or PBO. The isolation components include bondpads on the third metal level for connections to other devices. A dielectric layer is formed over the third metal level, exposing the bondpads. The isolation device contains no transistors.

10 Claims, 17 Drawing Sheets

(51) Int. Cl.
*H05K 1/16* (2006.01)
*H01L 23/62* (2006.01)
*H05K 1/02* (2006.01)
*H05K 3/46* (2006.01)
*H05K 3/00* (2006.01)
*H05K 1/11* (2006.01)

(52) U.S. Cl.
CPC *H05K 2201/0175* (2013.01); *H05K 2201/0191* (2013.01); *H05K 2201/0195* (2013.01); *H05K 2201/0746* (2013.01); *H05K 2201/0949* (2013.01); *H05K 2201/09409* (2013.01); *H05K 2201/09672* (2013.01)

(56) References Cited

U.S. PATENT DOCUMENTS

| | | | |
|---|---|---|---|
| 6,172,305 B1 * | 1/2001 | Tanahashi | H01L 23/50 174/255 |
| 6,713,835 B1 * | 3/2004 | Horak | H01L 21/7682 257/522 |
| 7,446,031 B2 * | 11/2008 | Lin | H01L 21/768 257/E21.495 |
| 2001/0050437 A1 * | 12/2001 | Saito | G03F 9/7084 257/758 |
| 2005/0285173 A1 * | 12/2005 | Nagai | H01L 21/02063 257/296 |
| 2006/0038182 A1 | 2/2006 | Rogers et al. | |
| 2007/0134924 A1 * | 6/2007 | Yaegashi | H01L 21/3105 438/697 |
| 2008/0044977 A1 * | 2/2008 | Lin | H01L 23/522 438/381 |
| 2008/0258195 A1 * | 10/2008 | Sugawara | H01L 21/76801 257/295 |
| 2009/0294803 A1 | 12/2009 | Nuzzo et al. | |
| 2009/0321889 A1 * | 12/2009 | Summerfelt | H01L 23/562 257/620 |
| 2010/0072577 A1 | 3/2010 | Nuzzo et al. | |
| 2010/0109128 A1 * | 5/2010 | West | H01L 23/562 257/620 |
| 2011/0220890 A1 | 9/2011 | Nuzzo et al. | |
| 2013/0071958 A1 * | 3/2013 | Kawano | H01L 24/05 438/17 |
| 2013/0320503 A1 | 12/2013 | Nuzzo et al. | |

* cited by examiner

HIGH VOLTAGE POLYMER DIELECTRIC CAPACITOR ISOLATION DEVICE

CROSS REFERENCE TO RELATED APPLICATIONS

This application is a continuation of U.S. Nonprovisional Patent Application Ser. No. 13/960,406, filed Aug. 6, 2013, the contents of which are herein incorporated by reference in its entirety.

FIELD OF THE INVENTION

This invention relates to the field of electronic isolation devices. More particularly, this invention relates to passive components in electronic isolation devices.

BACKGROUND OF THE INVENTION

An electronic isolation device may be used to transmit two or more signals between circuits which have different DC bias levels, for example several hundred volts. It may be desirable to minimize an area of the isolation device, and it may also be desirable to provide transient protection and surge protection of several thousand volts.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An electronic isolation device is formed on a monolithic substrate and includes a plurality of passive isolation components. The isolation components are formed in three metal levels. The first metal level is separated from the monolithic substrate by an inorganic pre-metal dielectric (PMD) layer. The second metal level is separated from the first metal level by a layer of silicon dioxide. The third metal level is separated from the second metal level by at least 20 microns of polyimide or poly(p-phenylene-2,6-benzobisoxazole) (PBO). The isolation components include bondpads on the third metal level for connections to other devices. A dielectric layer is formed over the third metal level, exposing the bondpads. The isolation device contains no transistors.

DETAILED DESCRIPTION OF EXAMPLE EMBODIMENTS

Figure 1A:
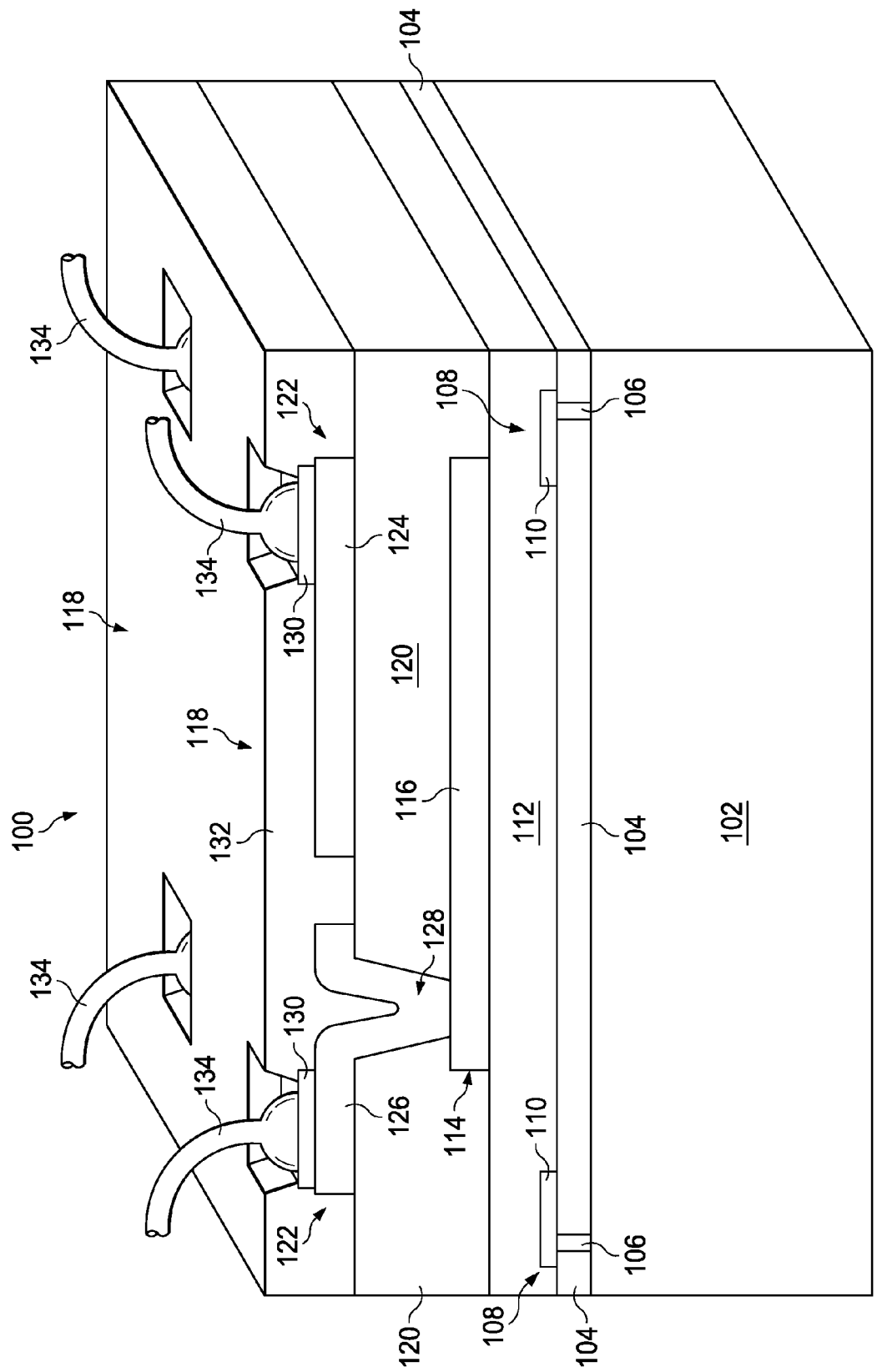
FIG. 1A through FIG. 1C are views of an exemplary isolation device containing a plurality of capacitors.

The following co-pending patent application contains related material and is hereby incorporated by reference: U.S. patent application Ser. No. 13/960,344 (Texas Instruments docket number TI-72810), filed Aug. 6, 2013, now U.S. Pat. No. 8,890,223.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An electronic isolation device is formed on a monolithic substrate and includes a plurality of passive isolation components. The isolation components are formed in three metal levels. A first metal level of the three metal levels is separated from the monolithic substrate by an inorganic PMD layer. A second metal level of the three metal levels is separated from the first metal level by a silicon dioxide layer. A third metal level of the three metal levels is separated from the second metal level by a polymer dielectric layer, which is at least 20 microns of polyimide PBO. The isolation components include bondpads on the third metal level for connections to other devices. A dielectric overcoat dielectric layer is formed over the third metal level, exposing the bondpads. The isolation device contains no transistors.

The isolation components may be capacitors, in which a first plate of each capacitor is provided for in the third metal level, and a second plate of each capacitor is provided for in the second metal level. The bondpad on the first plate is located over the second plate. A bondpad on the third metal level is connected to the second plate through a via in the polymer dielectric layer. The first metal level provides a ground line, and is electrically connected to the monolithic substrate through metal contacts in the PMD layer.

Alternatively, the isolation components may be transformers, in which a first winding of each transformer is provided for in the third metal level, and a second winding of each transformer is provided for in the second metal level. Bondpads for both windings are on the third metal level. The bondpads may be connected to ends of the windings directly or through links on the second metal level and possibly on the first metal level, with corresponding vias through the silicon dioxide layer and the PMD layer.

Figure 1B:
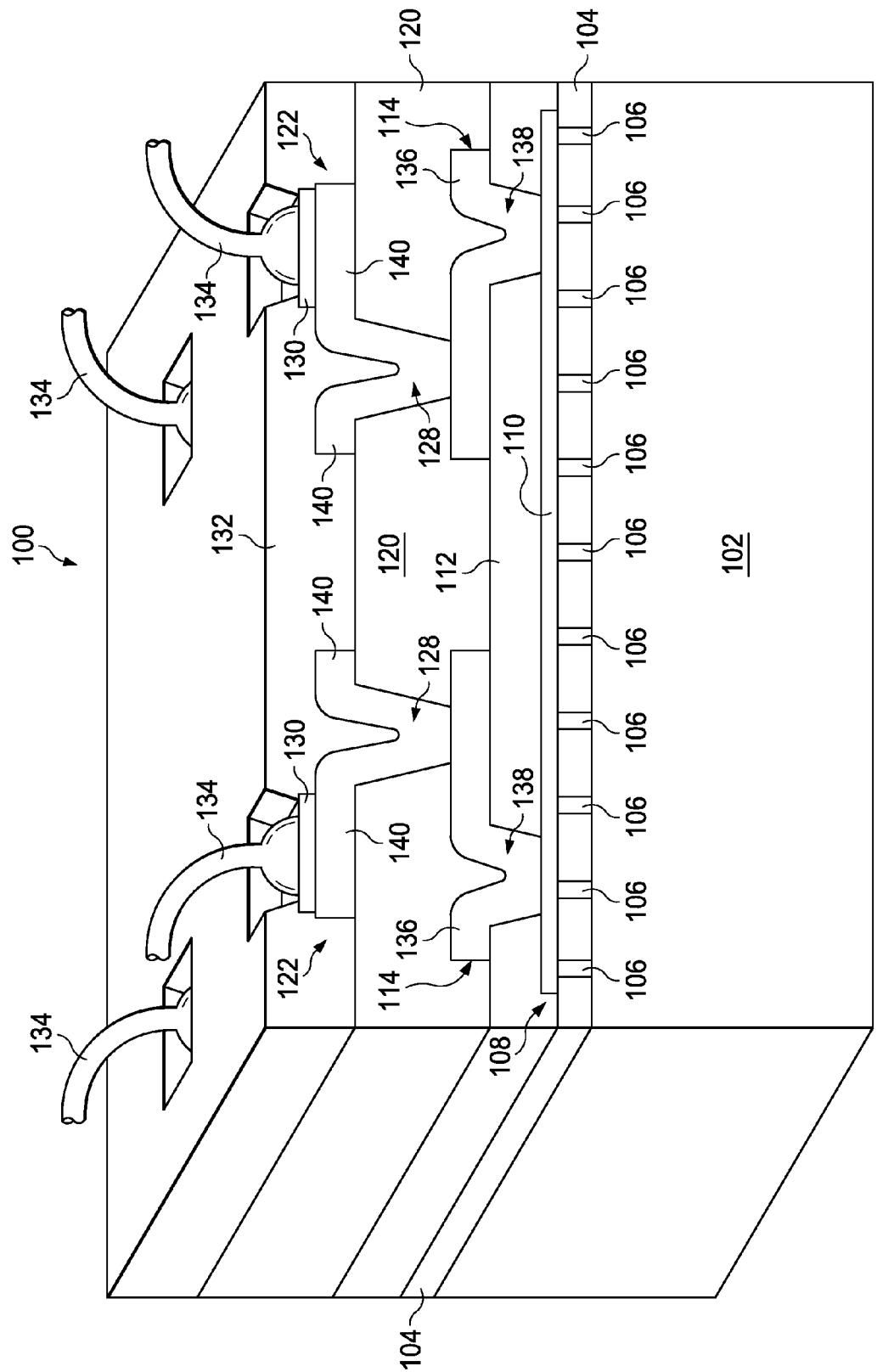
Figure 1C:
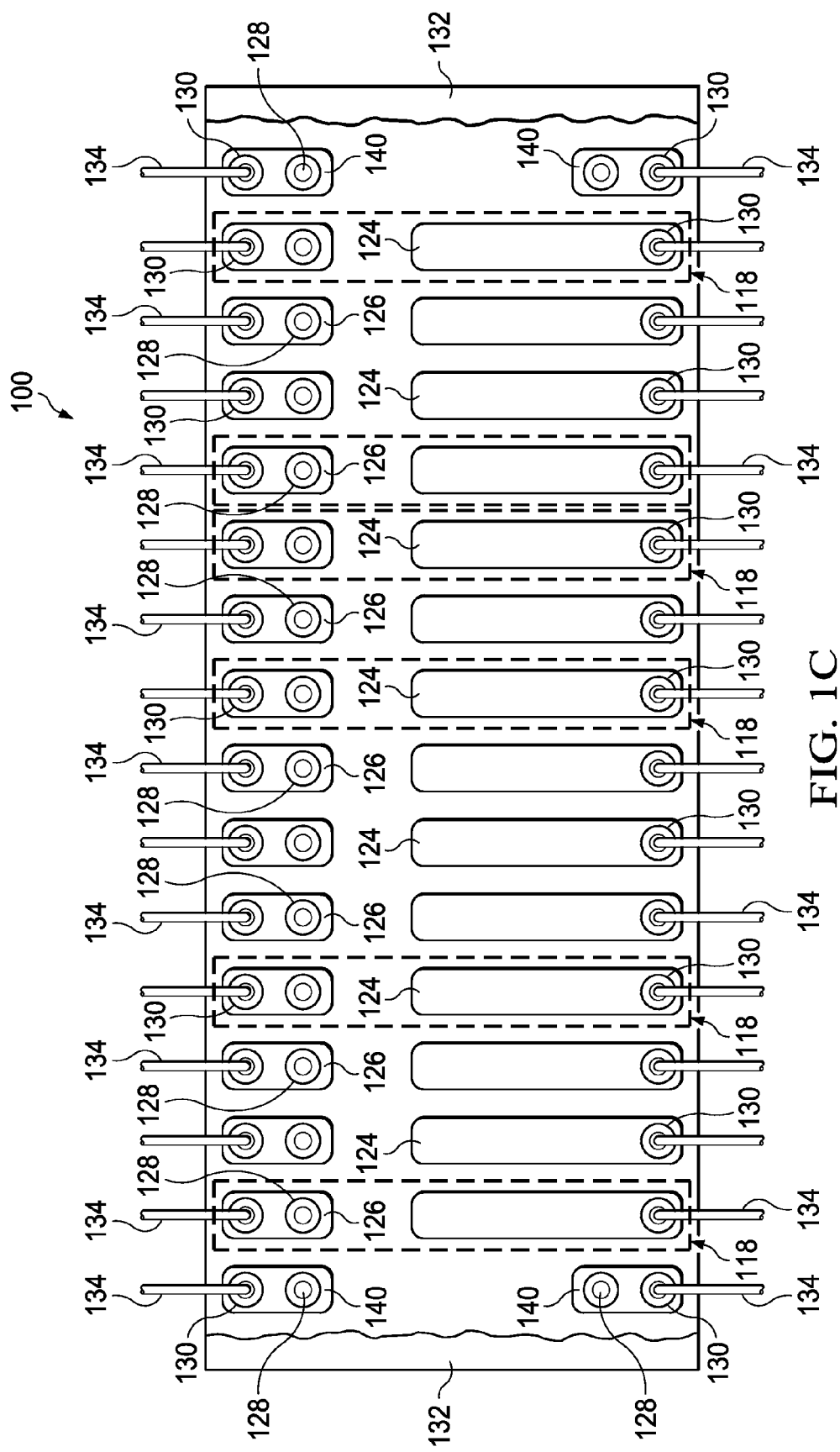

FIG. 1A through FIG. 1C are views of an exemplary isolation device containing a plurality of capacitors. FIG. 1A is a cross section depicting the structure of the capacitors. The isolation device 100 is formed on a monolithic substrate 102, which may be, for example, a single crystal silicon wafer 102. A PMD layer 104 100 to 1000 nanometers thick is formed on the monolithic substrate 102. The PMD layer 104 may be, for example, one or more layers of silicon dioxide and silicon nitride. Contacts 106 are formed through the PMD layer 104 to make electrical connections to the monolithic substrate 102.

A first metal level 108 is formed over the PMD layer 104. The first metal level 108 includes a ground bus 110 which makes electrical connections to top surfaces of the contacts 106. A silicon dioxide layer 112 is formed over the first metal level 108 and over the PMD layer 104. The silicon dioxide layer 112 may be at least 5 microns thick to provide electrical isolation between channels of the isolation device 100. Forming the silicon dioxide layer 112 at least 5 microns thick may advantageously allow signals through the isolation device 100 to operate at 3.3 volts; forming a thinner silicon dioxide layer 112 may require 5 volt signals. The silicon dioxide layer 112 includes primarily silicon dioxide.

A second metal level 114 is formed over the silicon dioxide layer 112. The second metal level 114 may have a main layer of copper or aluminum. The second metal level 114 may have a sheet resistance less than 10 milliohms/square. The second metal level 114 includes bottom plates 116 of the capacitors 118. Forming the second metal level 114 with a sheet resistance less than 10 milliohms/square may reduce a series resistance of the isolation device 100 and thus advantageously provide a higher signal-to-noise ratio for signals through the isolation device 100.

A polymer dielectric layer 120 at least 20 microns thick is formed over the second metal level 114 and over the silicon dioxide layer 112. The polymer dielectric layer 120 is formed primarily of a layer of at least 20 microns of polyimide or PBO. Upper via holes are formed in the polymer dielectric layer 120 so as to expose the second metal level 114.

A third metal level 122 is formed over the polymer dielectric layer 120. The third metal level may have a sheet resistance less than 10 milliohms/square, and may be formed of the same metals as the second metal level 114. The third metal level 122 includes top plates 124 of the capacitors 118. The third metal level 122 also includes bottom plate leads 126 which extend into the upper via holes to form upper vias 128 which make electrical connection to the bottom plates 116. The bottom plates 116, the top plates 124 and the polymer dielectric layer 120 between the bottom plates 116 and the top plates 124 provide the capacitors 118. A capacitance of each capacitor 118 may be, for example, 50 to 250 femtofarads. Forming the third metal level 122 with a sheet resistance less than 10 milliohms/square may reduce a series resistance of the isolation device 100 and thus advantageously provide a higher signal-to-noise ratio for signals through the isolation device 100, in a similar manner as forming the second metal level 114 with a sheet resistance less than 10 milliohms/square.

Bondpads 130 are formed over the third metal level 122 to provide connections to the top plates 124 and the bottom plate leads 126. Instances of the bondpads 130 over the top plates 124 are disposed over the bottom plates 116, which may advantageously reduce an area of the isolation device 100. A dielectric overcoat dielectric layer 132 is formed over the third metal level 122 and the polymer dielectric layer 120, exposing the bondpads 130. The dielectric overcoat dielectric layer 132 may be, for example, polyimide or PBO. During assembly of the isolation device 100 into a multi-chip electronic module, wire bonds 134 are formed on the bondpads 130 to provide connections between the capacitors 118 of the isolation device 100 and other electronic devices in the multi-chip module, not shown.

FIG. 1B is a cross section depicting the structure of the ground bus 110. Lower via holes are formed in the silicon dioxide layer 112 so as to expose the ground bus 110. The second metal level 114 includes lower ground leads 136 which overlap a top surface of the silicon dioxide layer 112 and extend into the lower via holes to form lower vias 138 which make electrical connection to the ground bus 110. The third metal level 122 includes upper ground leads 140 which overlap a top surface of the silicon dioxide layer 112 and include instances of the upper vias 128 which make electrical connection to the lower ground leads 136. Instances of the bondpads 130 are formed over the upper ground leads 140 to provide connections to the ground bus 110. During assembly of the isolation device 100, instances of the wire bonds 134 are formed on the bondpads 130 over the upper ground leads 140 to provide connections between the ground bus 110 and the other electronic devices in the multi-chip module.

FIG. 1C is a top view depicting an exemplary layout of the capacitors 118. The dielectric overcoat dielectric layer 132 is removed from a portion of the isolation device 100 to more clearly show the layout of the capacitors 118. The capacitors 118 may be configured in a linear array so that the bondpads 130 are located proximate to lateral boundaries of the isolation device 100. The upper ground leads 140 may be located at ends of the isolation device 100 as depicted in FIG. 1C or may be distributed throughout the capacitors 118.

Forming the capacitors 118 so as to be electrically isolated from the monolithic substrate 102 by the silicon dioxide layer 112 may provide a desired level of long term reliability for the isolation device 100. Forming the capacitors 118 so as to have the polyimide or PBO polymer dielectric layer 120 for a capacitor dielectric may provide a desired level of transient protection and surge protection for the isolation device 100. For example, forming the polymer dielectric layer 120 at least 20 microns thick may enable the capacitors 118 to be operable to 400 volts continuous operation, and able to withstand a voltage transient up to 5000 root-mean-square (rms) volts and a voltage surge up 10000 volts.

Figure 2A:
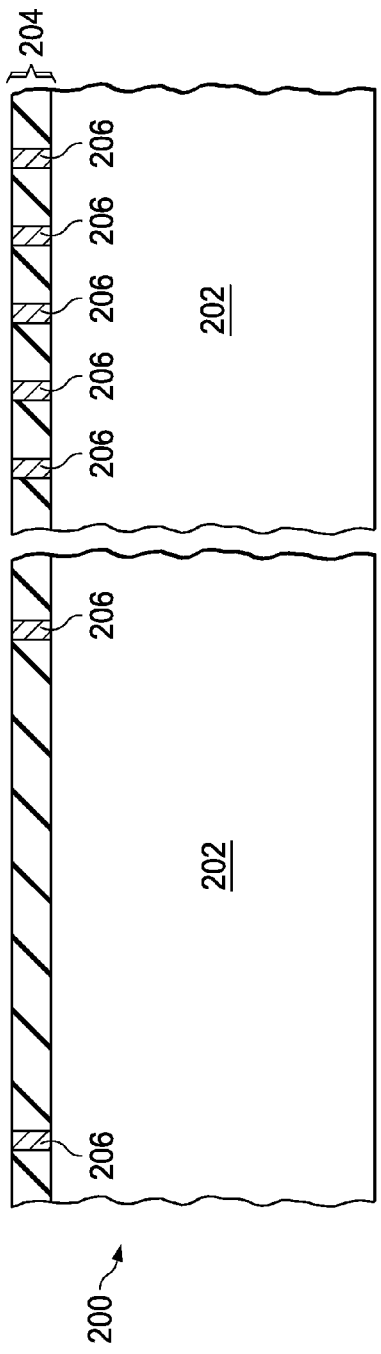
FIG. 2A through FIG. 2L are cross sections of an isolation device containing capacitors, formed according to an exemplary process sequence, depicted in successive stages of fabrication.

FIG. 2A through FIG. 2L are cross sections of an isolation device containing capacitors, formed according to an exemplary process sequence, depicted in successive stages of fabrication. Referring to FIG. 2A, the isolation device 200 is formed on a monolithic substrate 202 such as a single crystal silicon wafer 202. A PMD layer 204 is formed on the monolithic substrate 202. The PMD layer 204 may be, for example, one or more layers of silicon dioxide and silicon nitride, formed by thermal oxidation of the monolithic substrate and chemical vapor deposition (CVD). A thickness of the PMD layer may be 100 to 1000 nanometers.

Contacts 206 are formed through the PMD layer 204 to make electrical connections to the monolithic substrate 202. The contacts 206 may be formed by etching contact holes through the PMD layer 204 to expose the monolithic substrate 202 using a reactive ion etch (RIE) process and filling the contact holes concurrently with deposition of the first metal level. Alternately, the contacts 206 may be formed by etching contact holes through the PMD layer 204 to expose the monolithic substrate 202, forming a liner of titanium and titanium nitride using a sputter process and an atomic layer deposition (ALD) process respectively, forming a tungsten layer on the liner using a CVD process so as to fill the contact holes, and removing the tungsten and liner from a top surface of the PMD layer 204 using etchback or chemical mechanical polish (CMP) processes.

Figure 2B:
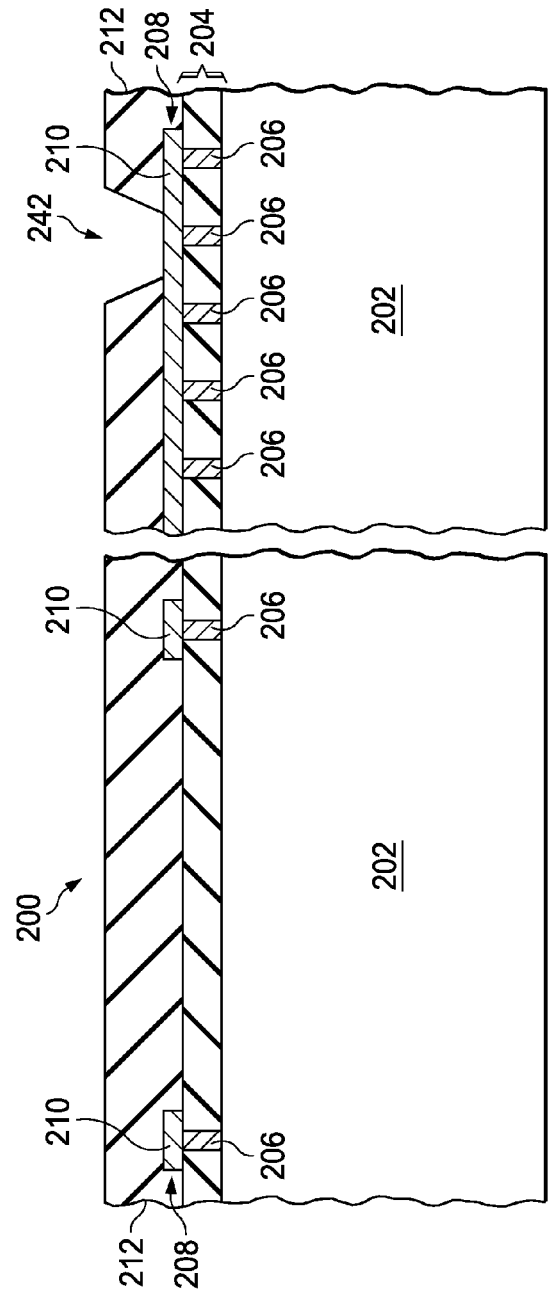

Referring to FIG. 2B, a first metal level 208 is formed over the PMD layer 204. The first metal level 208 includes a ground bus 210 which makes electrical connections to top surfaces of the contacts 206. In one version of the instant example, the first metal level 208 may be formed by forming a first layer of interconnect metal on the PMD layer 204, including an adhesion layer of 10 to 50 nanometers of titanium tungsten or titanium, an aluminum layer 100 to 500 nanometers thick on the adhesion layer, and possibly an optional antireflection layer of titanium nitride 20 to 50 nanometers thick on the aluminum layer. An etch mask is formed over the aluminum layer and the antireflection layer if present; the etch mask may include photoresist formed by a photolithographic process. Metal is removed from the first layer of interconnect metal, in areas exposed by the etch mask, possibly with a wet etch process using an aqueous mixture of phosphoric acid, acetic acid and nitric acid, commonly referred to as aluminum leach etch. Alternatively, the metal may be removed with an RIE process using chlorine radicals. The etch mask is subsequently removed using an oxygen ash process.

In an alternate version of the instant example, the first metal level 208 may be formed with a damascene process, in which an intra-metal dielectric layer is formed over the PMD layer 204, and trenches are formed in the intra-metal dielectric layer. The trenches expose the top surfaces of the contacts 206. Interconnect metal, such as a titanium and titanium nitride liner and tungsten fill metal, or a tantalum nitride liner and copper fill metal, is formed on the intra-metal dielectric layer and in the trenches. The interconnect metal is removed from a top surface of the intra-metal dielectric layer using a CMP process, leaving the first metal level 208 in the trenches.

A silicon dioxide layer 212 is formed over the first metal level 208 and over the PMD layer 204. The silicon dioxide layer 212 may be at least 5 microns thick. The silicon dioxide layer 212 may be formed with a plasma enhanced chemical vapor deposition (PECVD) process using tetraethyl orthosilicate, also known as tetraethoxysilane or TEOS. Lower via holes 242 are formed in the silicon dioxide layer 212, exposing the ground bus 210. The lower via holes 242 may be formed by forming an etch mask, not shown, over the silicon dioxide layer 212 which exposes areas for the lower via holes 242, and removing silicon dioxide from the silicon dioxide layer 212 with a an RIE process in the areas exposed by the etch mask, to form the lower via holes 242. The etch mask is subsequently removed, for example with an oxygen ash process.

Figure 2C:
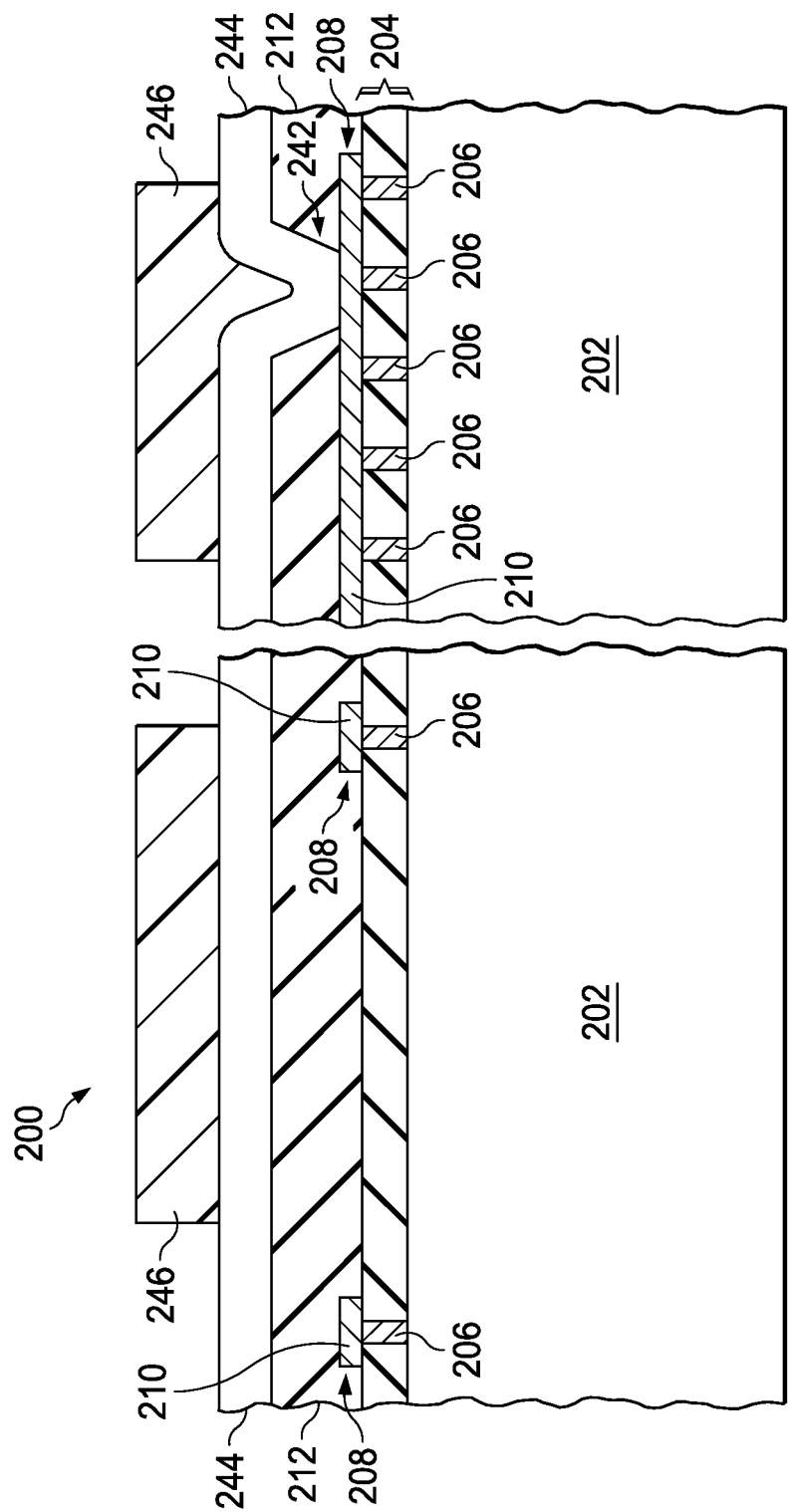

Referring to FIG. 2C, a second layer of interconnect metal 244 is formed over the silicon dioxide layer 212, extending into the lower via holes 242 and making electrical connection to the ground bus 210. The second layer of interconnect metal 244 may have a sheet resistance less than 10 milliohms/square. In the instant example, the second layer of interconnect metal 244 includes an adhesion layer of 10 to 50 nanometers of titanium tungsten or titanium, an aluminum layer 6 to 8 microns thick on the adhesion layer, and an optional antireflection layer of titanium nitride 20 to 50 nanometers thick on the aluminum layer. A second metal etch mask 246 is formed over the second layer of interconnect metal 244 to cover areas for a subsequently formed second metal level.

Figure 2D:
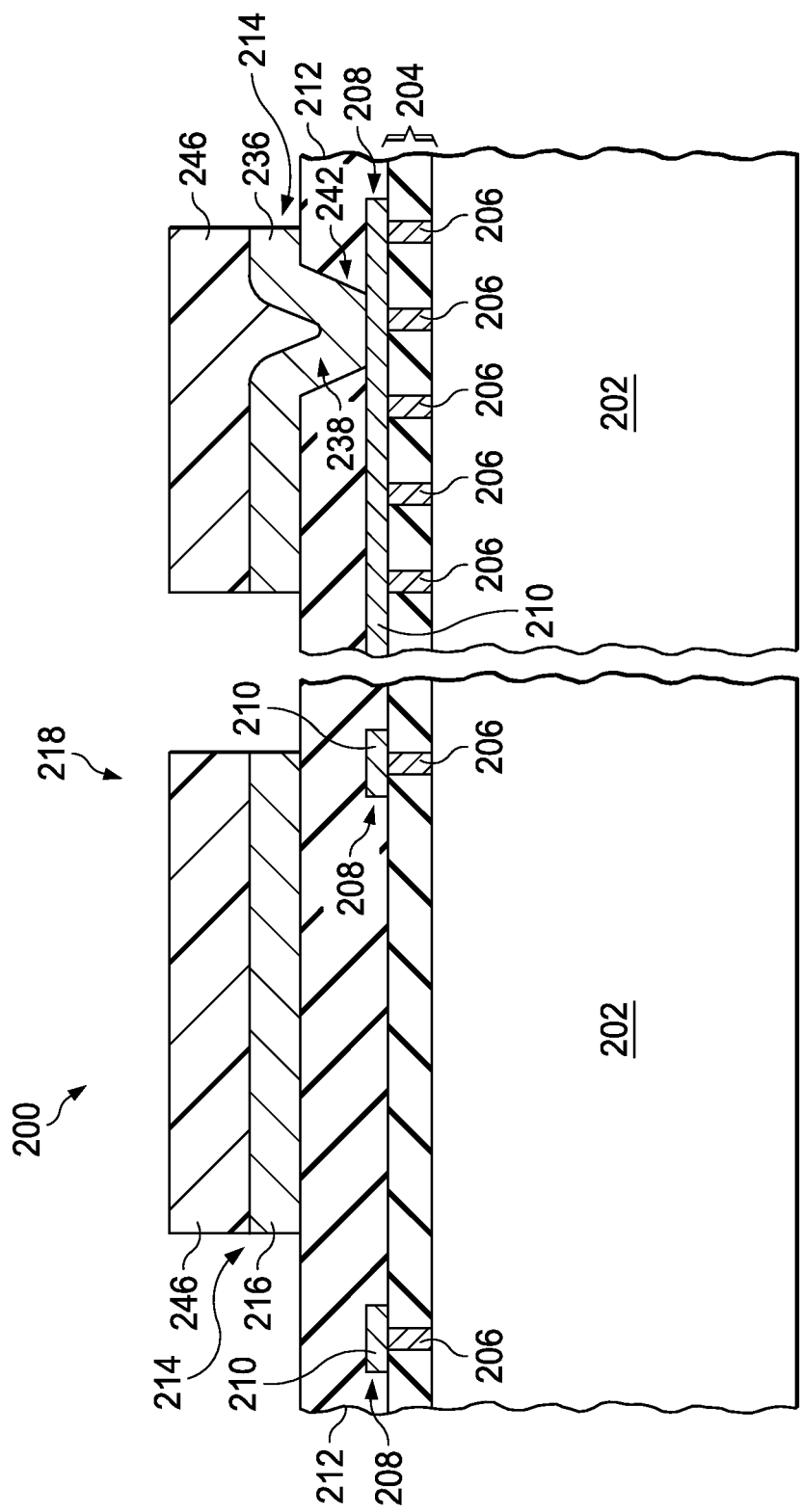

Referring to FIG. 2D, a metal etch process removes the second layer of interconnect metal 244 of FIG. 2C in areas exposed by the second metal etch mask 246 to form the second metal level 214. The second metal level 214 includes bottom plates 216 of the capacitors 218 and lower ground leads 236 which overlap a top surface of the silicon dioxide layer 212 and extend into the via holes to form lower vias 238 which make electrical connection to the ground bus 210. The metal etch process may be a wet etch process using aluminum leach etch, or an RIE process suing chlorine radicals. The second metal etch mask 246 is subsequently removed, for example with an oxygen ash process.

Alternately, the second metal level 214 may be formed using a plated copper metallization process as described for the third metal level. Details of the plated copper metallization process are discussed in reference to FIG. 2F through FIG. 2I.

Figure 2E:
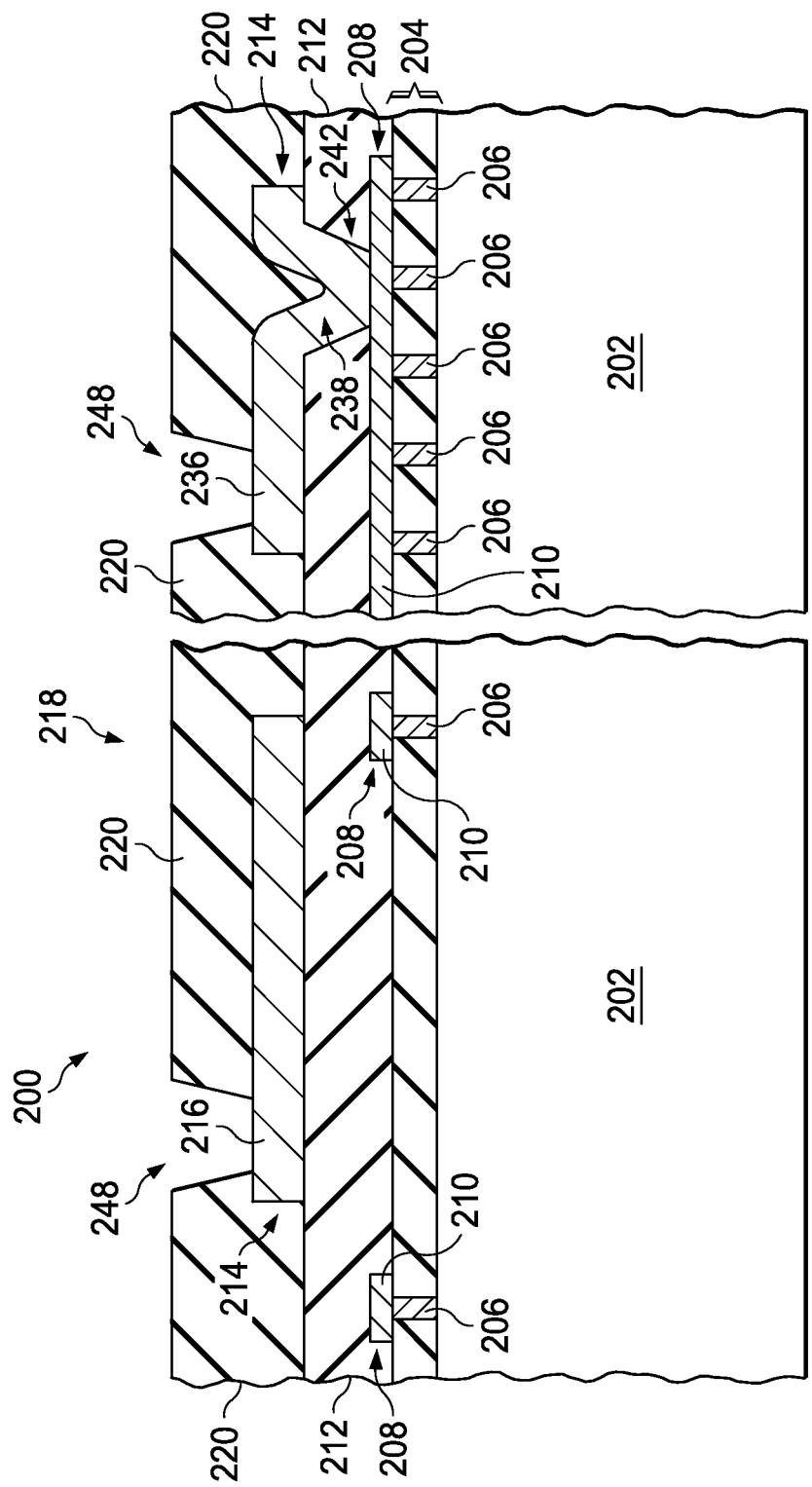

Referring to FIG. 2E, a polymer dielectric layer 220 at least 20 microns thick is formed over the second metal level 214 and over the silicon dioxide layer 212. The polymer dielectric layer 220 is formed of polyimide or PBO. Upper via holes 248 are formed in the polymer dielectric layer 220 so as to expose the bottom plates 216 and the lower ground leads 236. The upper via holes 248 may be formed by photopatterning the polymer dielectric layer 220 with a photolithographic process.

Figure 2F:
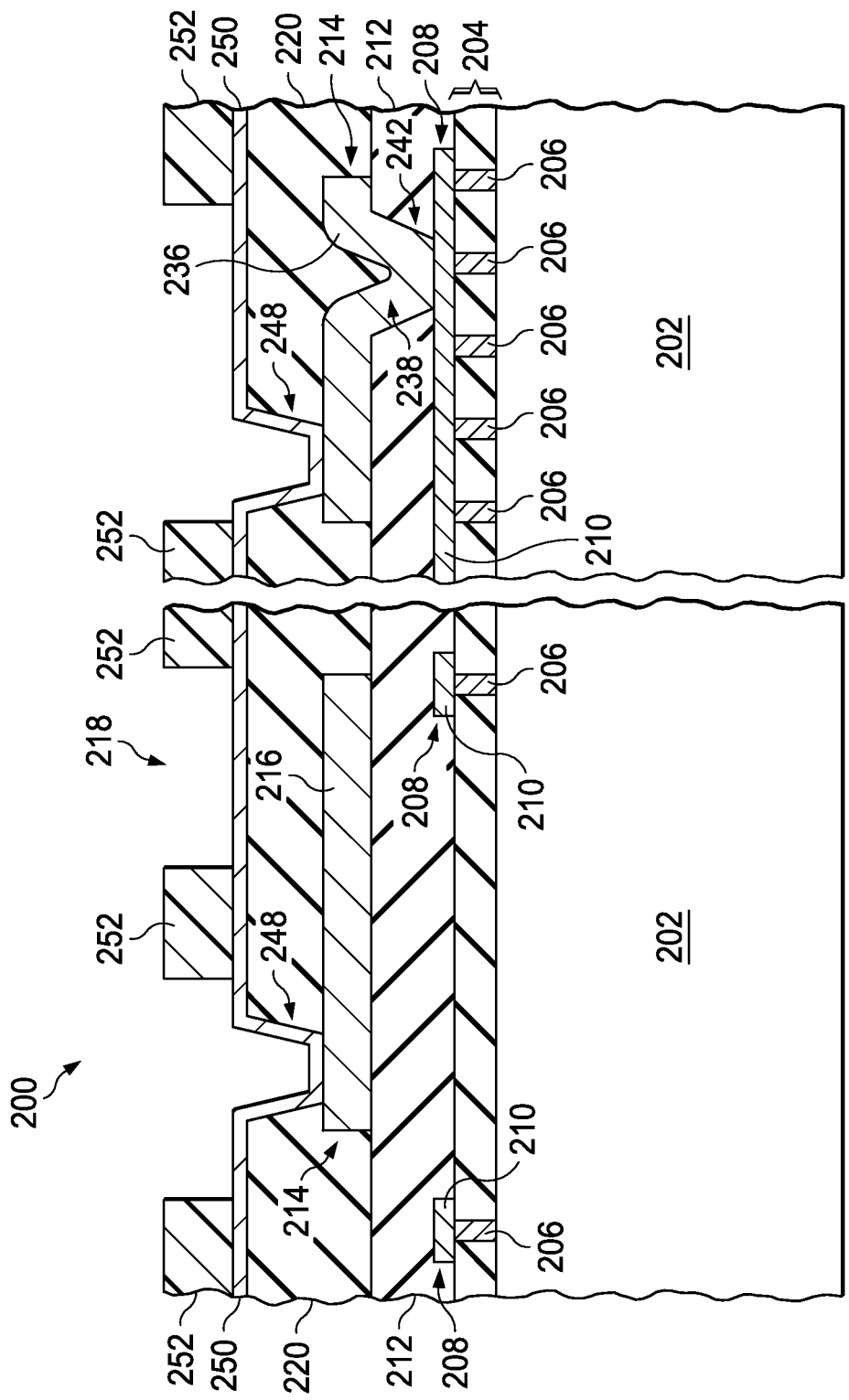

Referring to FIG. 2F, a metal seed layer 250 is formed over the polymer dielectric layer 220, extending into the upper via holes 248 and contacting the bottom plates 216 and the lower ground leads 236. The metal seed layer 250 may include, for example, an adhesion layer of 10 to 50 nanometers of titanium tungsten and a plating layer of 50 to 200 nanometers of sputtered copper.

A plating mask 252 is formed over the metal seed layer 250 to expose areas for a subsequently formed third metal level. The plating mask 252 may include photoresist and may be 20 percent to 80 percent thicker than the subsequently formed third metal level.

Figure 2G:
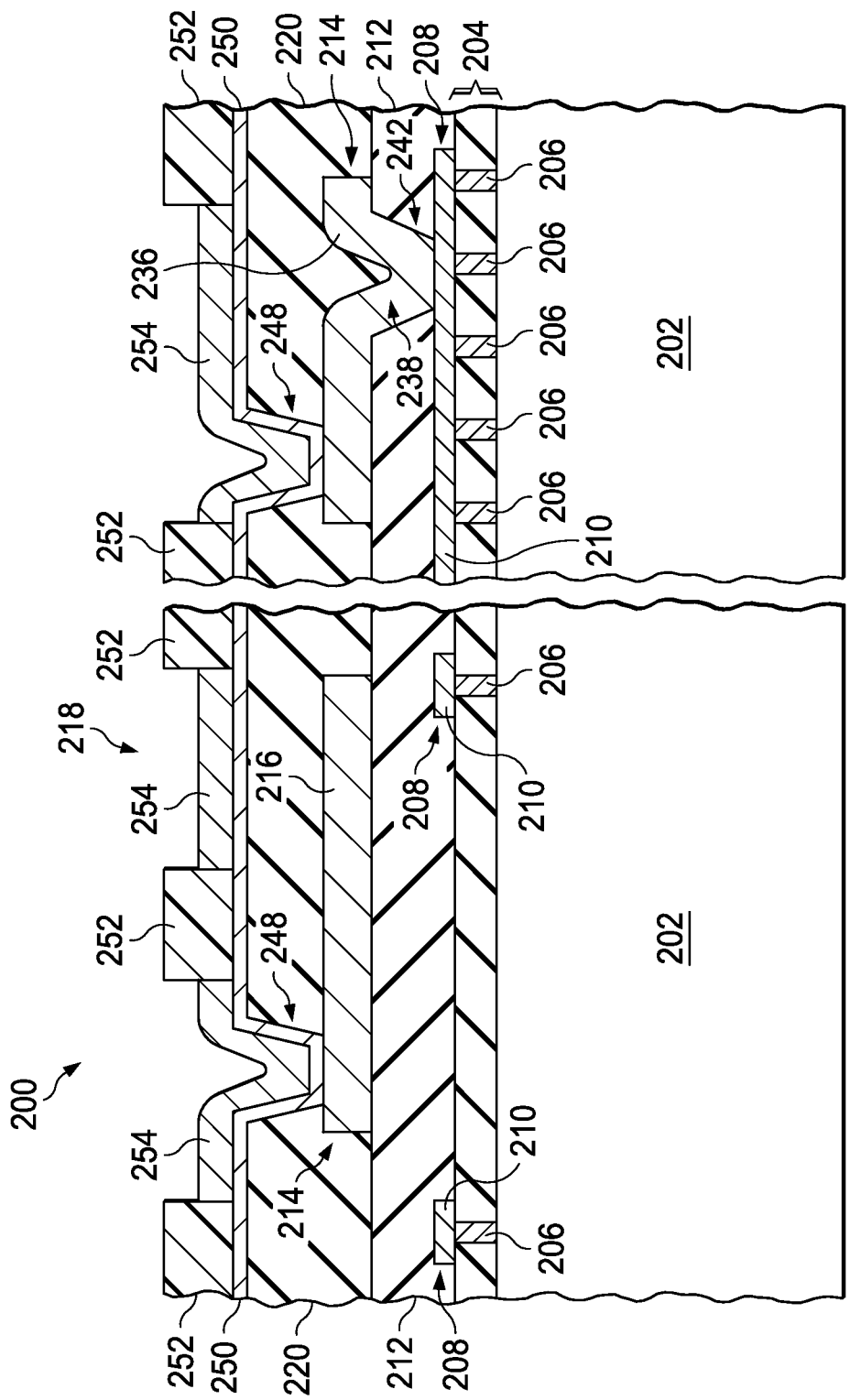

Referring to FIG. 2G, an electroplating operation forms plated copper 254 on the metal seed layer 250 in the areas exposed by the plating mask 252. The plated copper 254 extends into the upper via holes 248. The plated copper 254 in parallel with the metal seed layer 250 may have a sheet resistance less than 10 milliohms/square. In one version of the instant example, the plated copper 254 may be 4 to 6 microns thick.

Figure 2H:
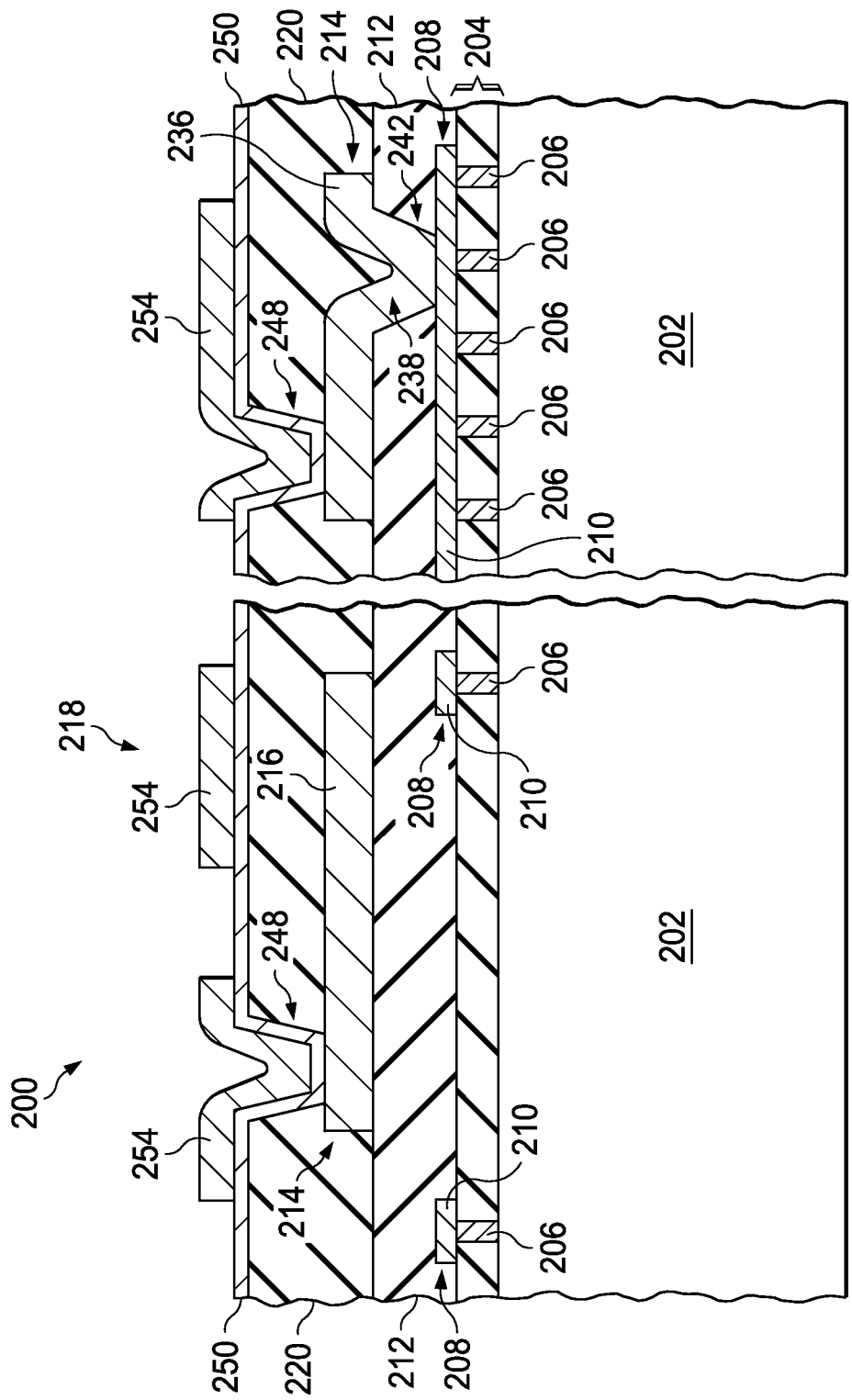

Referring to FIG. 2H, the plating mask 252 of FIG. 2G is removed. The plating mask 252 may be removed by dissolving polymer materials of the plating mask 252 in an appropriate solvent such as acetone or N-methylpyrrolidinone, commonly referred to as NMP.

Figure 2I:
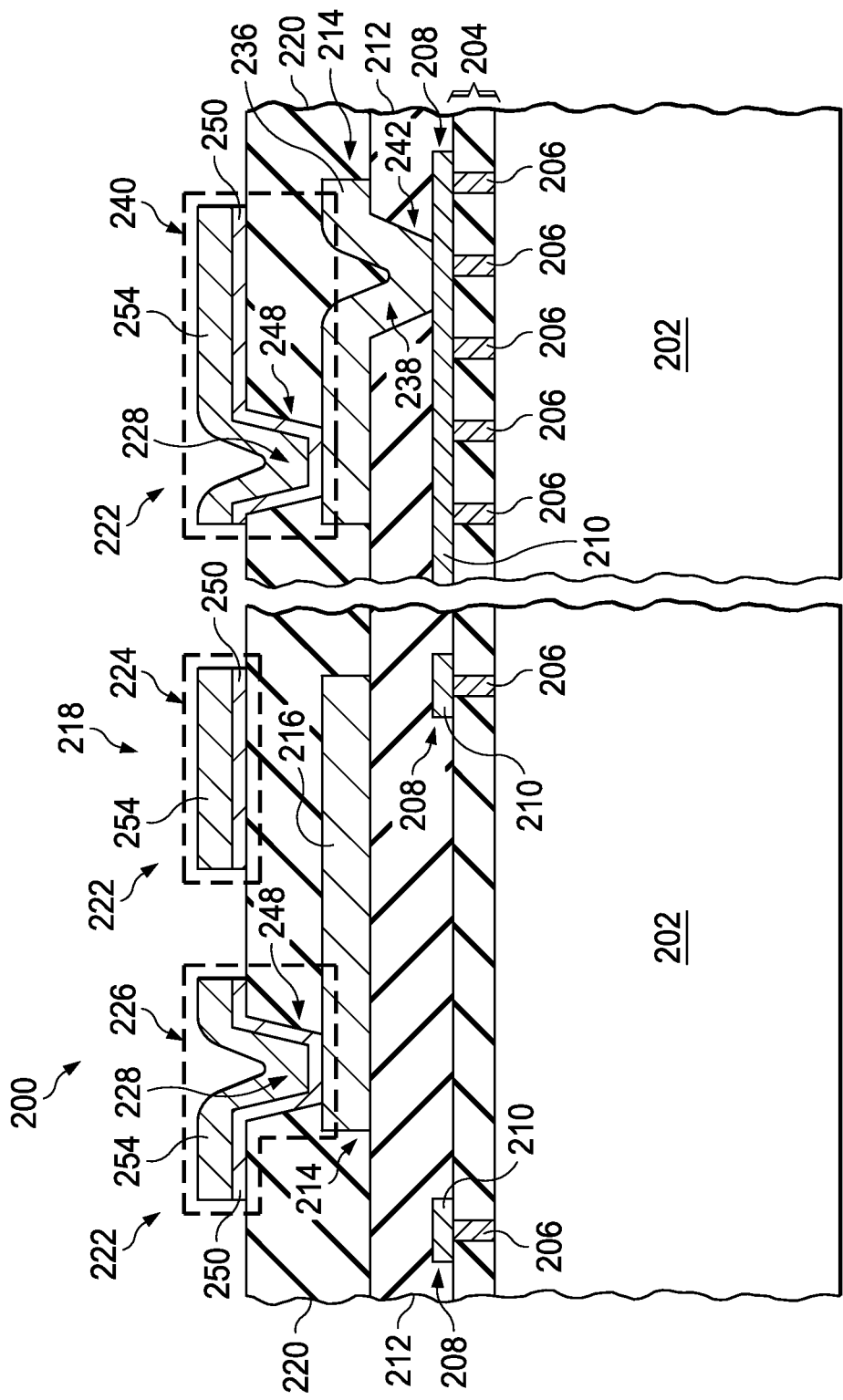

Referring to FIG. 2I, a seed metal etch process removes the metal seed layer 250 in areas outside the plated copper 254. The seed metal etch process may include an aqueous solution of nitric acid and hydrogen peroxide or an aqueous solution of ammonium hydroxide and hydrogen peroxide. The remaining metal seed layer 250 in combination with the plated copper 254 provides the third metal level 222. The third metal level 222 extends into the upper via holes 248 to form upper vias 228 which make electrical connection to the second metal level 214.

The third metal level 222 includes top plates 224 of the capacitors 218, and bottom plate leads 226 which make electrical connections to the bottom plates 216 through instances of the upper vias 228. The third metal level 222 also includes upper ground leads 240 which overlap a top surface of the silicon dioxide layer 212 and which make electrical connection to the lower ground leads 236 through instances of the upper vias 228.

Figure 2J:
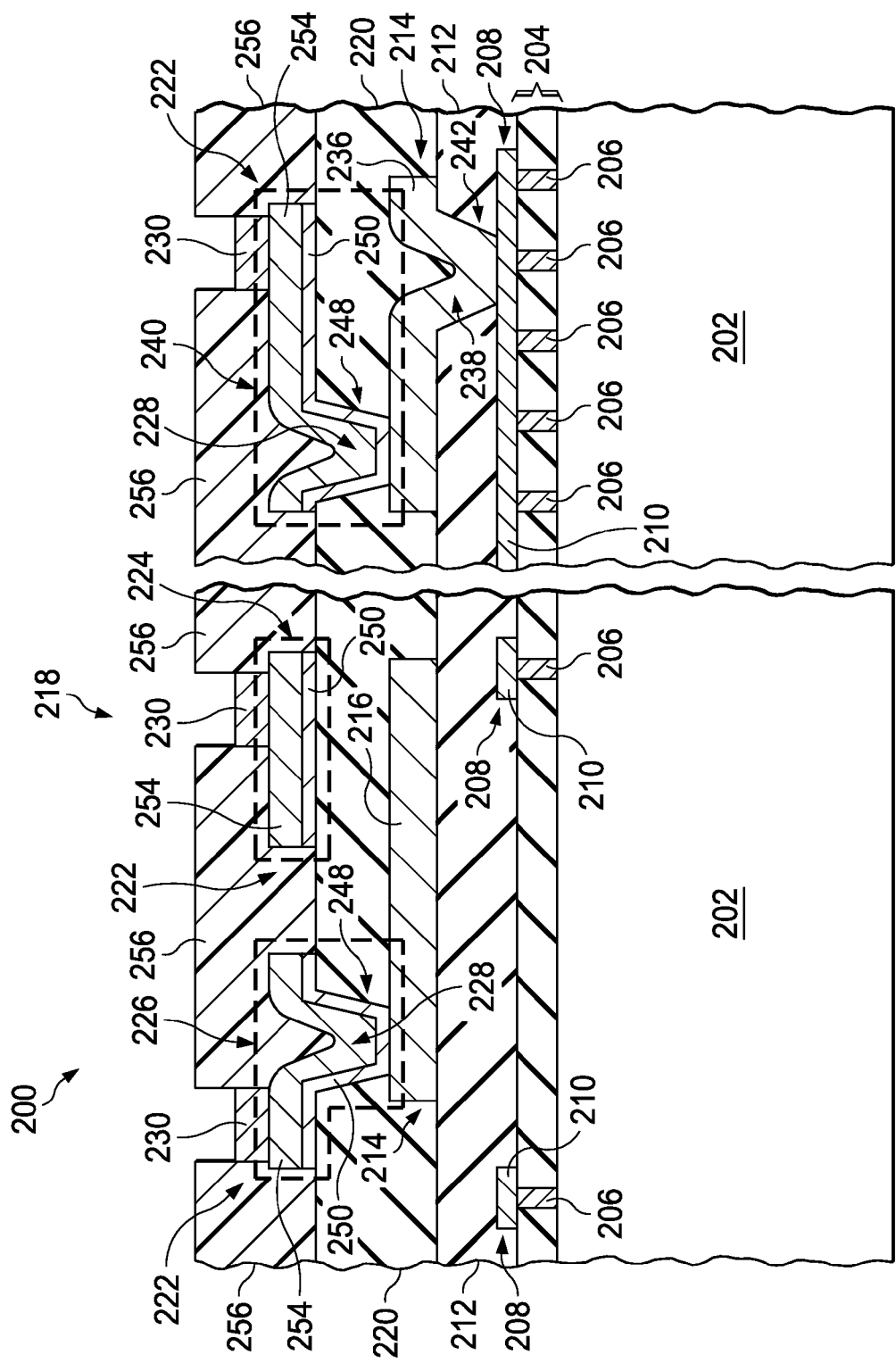

Referring to FIG. 2J, a bondpad plating mask 256 is formed over the third metal level 222 and the polymer dielectric layer 220, exposing areas on the top plates 224, the bottom plate leads 226 and the upper ground leads 240, for subsequently formed bondpads. The bondpad plating mask 256 may include photoresist 1 to 2 microns thick, and be formed using a photolithographic process.

A bondpad plating process forms plated bondpads 230 on the top plates 224, the bottom plate leads 226 and the upper ground leads 240, in the areas exposed by the bondpad plating mask 256. The bondpads 230 may include layers of nickel, palladium and gold.

Figure 2K:
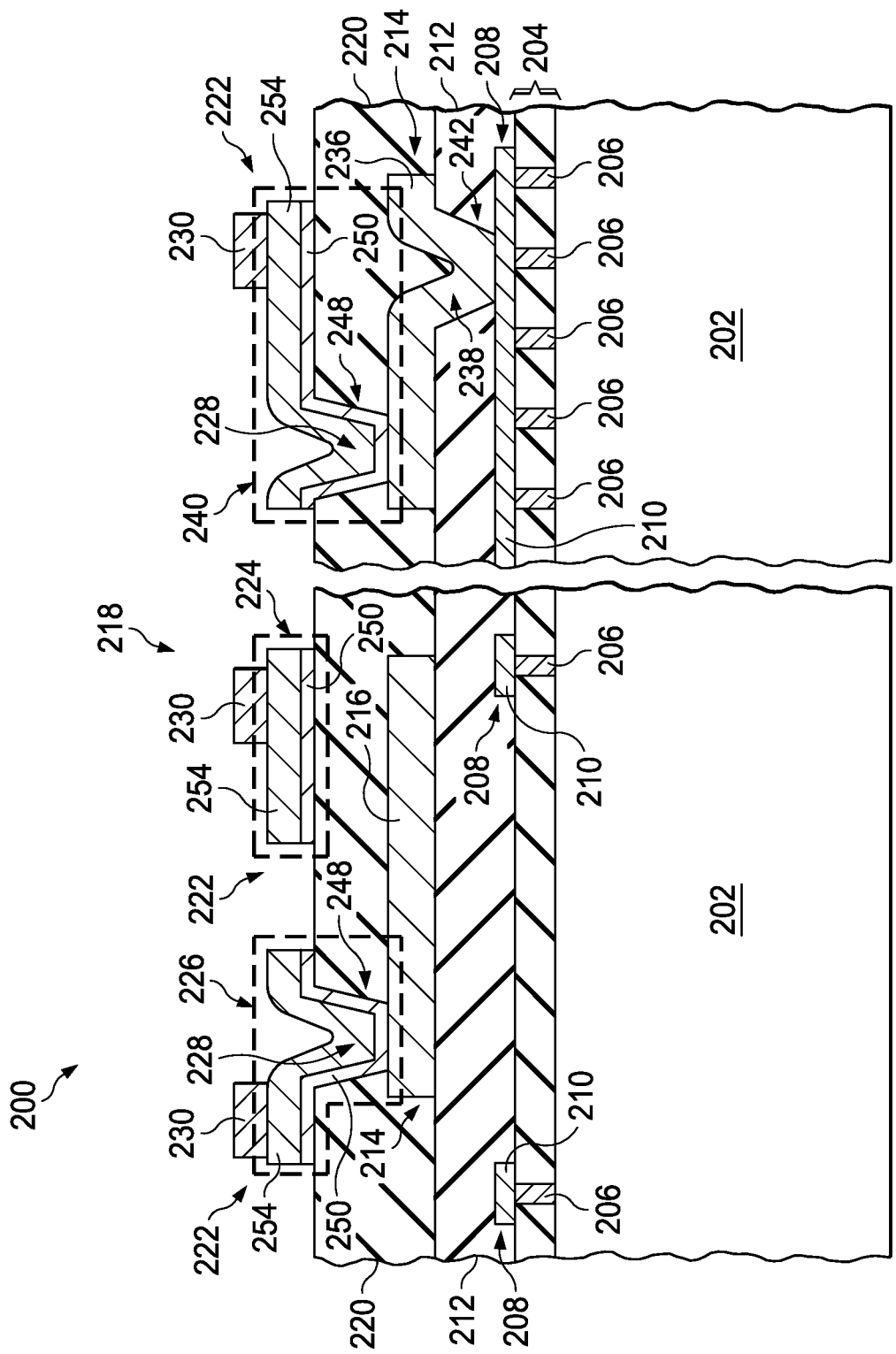

Referring to FIG. 2K, the bondpad plating mask 256 of FIG. 2J is removed. The bondpad plating mask 256 may be removed in a similar manner to the plating mask 252 as discussed in reference to FIG. 2H.

Figure 2L:
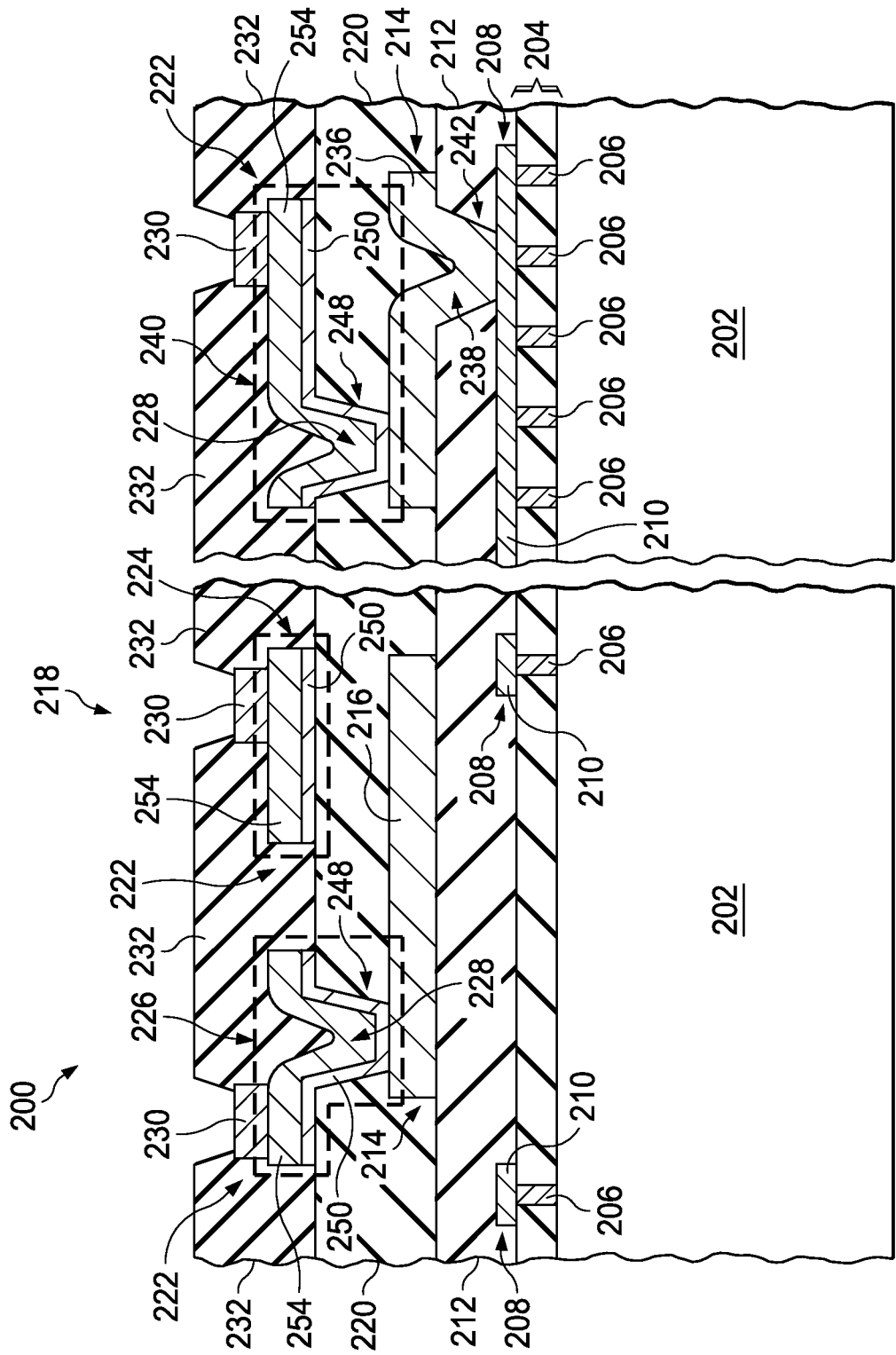

Referring to FIG. 2L, a dielectric overcoat dielectric layer 232 is formed over the third metal level 222 and the polymer dielectric layer 220, exposing the bondpads 230. The dielectric overcoat dielectric layer 232 may be, for example, polyimide or PBO, formed by a photolithographic process.

It will be recognized that the second metal level 214 and the third metal level 222 may be formed using similar processes. In one version of the instant example, both the second metal level 214 and the third metal level 222 may be formed of an aluminum-based metallization as discussed in reference to FIG. 2C and FIG. 2D. In an alternate version, both the second metal level 214 and the third metal level 222 may be formed of a plated copper metallization as discussed in reference to FIG. 2F through FIG. 2I. Other processes for forming the second metal level 214 and the third metal level 222 are within the scope of the instant example. Other metallization structures, for example, gold, for the second metal level 214 and the third metal level 222 are also within the scope of the instant example.

Figure 3:
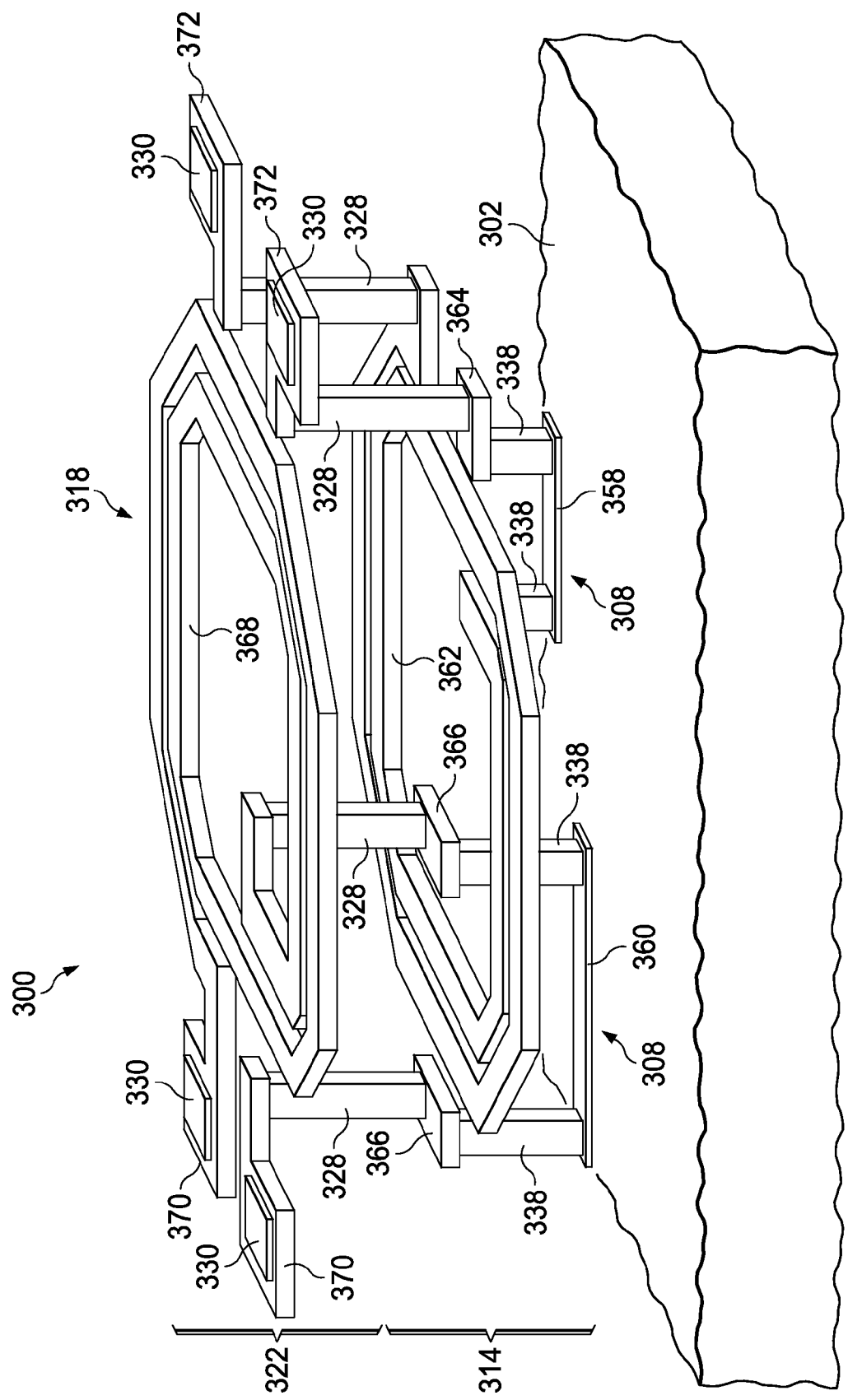
FIG. 3 is a perspective view of an exemplary transformer in an isolation device.

An isolation device may have transformers as isolation components. FIG. 3 is a perspective view of an exemplary transformer in an isolation device. Dielectric layers have been omitted from FIG. 3 to more clearly show windings of the transformer. The isolation device 300 is formed on a monolithic substrate 302, which may be, for example, a single crystal silicon wafer 302. A PMD layer, not shown in FIG. 3, is formed over the substrate 302. In the instant example, the PMD layer may be at least 5 microns thick, and may include one or more layers of silicon nitride and silicon dioxide. A first metal level 308 is formed over the PMD layer, for example as described in reference to FIG. 2B. The first metal level 308 includes a first metal lower winding link 358 and a first metal upper winding link 360.

A silicon dioxide layer, not shown in FIG. 3, is formed over the first metal level 308 and over the PMD layer. Lower via holes are formed in the silicon dioxide layer to expose the first metal lower winding link 358 and the first metal upper winding link 360. The silicon dioxide layer may be formed, for example, as described in reference to FIG. 2B.

A second metal level 314 is formed over the silicon dioxide layer and in the lower via holes, forming lower vias 338. The second metal level 314 may be formed, for example, of an aluminum-based metallization as described in reference to FIG. 2C and FIG. 2D, or may be formed of a plated copper metallization as discussed in reference to FIG. 2F through FIG. 2I. The second metal level 314 includes a lower winding 362 of the transformer 318, a second metal lower winding link 364, and second metal upper winding links 366. An inductance of the lower winding 362 may be, for example, 50 nanohenries to 400 nanohenries.

A polymer dielectric layer at least 20 microns thick, not shown in FIG. 3, is formed over the second metal level 314 and over the silicon dioxide layer. The polymer dielectric layer is formed of polyimide or PBO. Upper via holes are formed in the polymer dielectric layer so as to expose lower winding 362, the second metal lower winding link 364, and the second metal upper winding links 366. The polymer dielectric layer may be formed, for example, as described in reference to FIG. 2E.

A third metal level 322 is formed over the polymer dielectric layer and in the upper via holes, forming upper vias 328. The third metal level 322 may be formed, for example, of an aluminum-based metallization as described in reference to FIG. 2C and FIG. 2D, or may be formed of a plated copper metallization as discussed in reference to FIG. 2F through FIG. 2I. The third metal level 322 includes an upper winding 368 of the transformer 318, upper winding bond areas 370 and lower winding bond areas 372. An inductance of the upper winding 368 may be, for example, 50 nanohenries to 400 nanohenries. The lower winding bond areas 372 are coupled to the lower winding 362 through instances of the upper vias 328.

Bondpads 330 are formed over the upper winding bond areas 370 and the lower winding bond areas 372. The bondpads 330 may be formed as described in reference to FIG. 2J and FIG. 2K. A dielectric overcoat dielectric layer, not shown in FIG. 3, is formed over the third metal level 322 and the polymer dielectric layer, exposing the bondpads 330. The dielectric overcoat dielectric layer may be, for example, polyimide or PBO, and formed by a photolithographic process.

The isolation device 300 contains a plurality of the transformer 318. The isolation device 300 may also include connections to the substrate 302 similar to those described in reference to FIG. 1B. Forming the transformer 318 so as to be electrically isolated from the substrate 302 by the silicon dioxide layer may provide a desired level of long term reliability for the isolation device 300. Forming the transformer 318 so as to have the polyimide or PBO polymer dielectric layer separating the lower winding 362 from the upper winding 368 may provide a desired level of transient protection and surge protection for the isolation device 300. For example, each of the transformers 318 may be operable to 400 volts continuous operation, and able to withstand a voltage transient up to 5000 rms volts and a voltage surge up 10000 volts.

Figure 4:
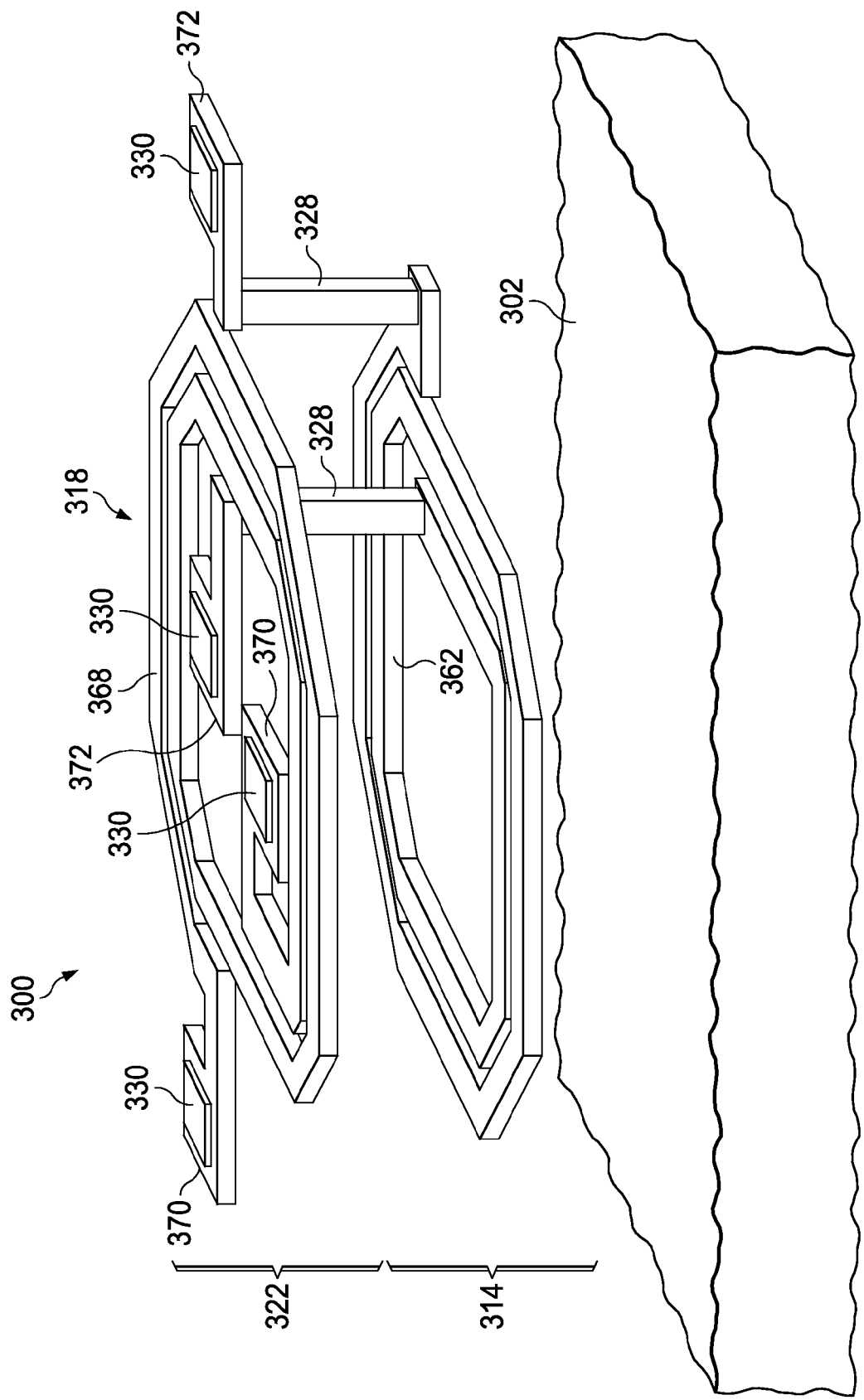
FIG. 4 depicts an alternate configuration for the transformer.

FIG. 4 depicts an alternate configuration for the transformer 318. In the instant example, links in the first metal level are eliminated. The substrate 302 is connected to bondpads, not shown in FIG. 4, at the third metal level 322.

Figure 5:
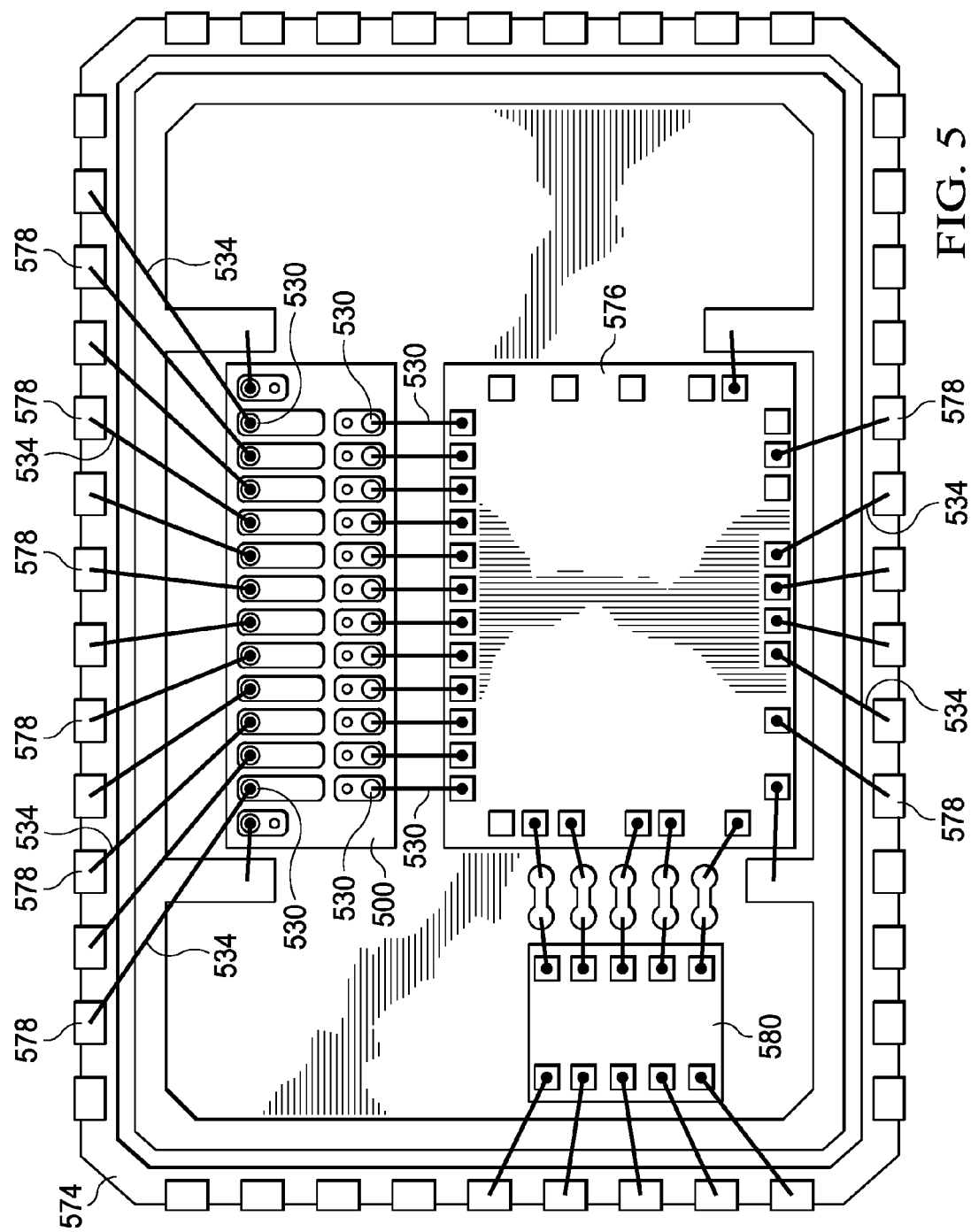
FIG. 5 depicts an isolation device in an exemplary configuration in a chip carrier.

FIG. 5 depicts an isolation device in an exemplary configuration in a chip carrier. The isolation device 500 is mounted in the chip carrier 574. A signal processor integrated circuit 576 is mounted in the chip carrier 574 adjacent to the isolation device 500. Wire bonds 534 connect bond pads 530 on top plates of isolation capacitors of the isolation device 500 to terminals 578 of the chip carrier 574. Additional wire bonds 534 connect bond pads 530 connected to lower plates of the isolation capacitors to bond pads on the signal processor integrated circuit 576. Further wire bonds 534 connect output bond pads of the signal processor integrated circuit 576 to additional terminals 578 of the chip carrier 574. Additional devices 580 may be mounted in the chip carrier 574.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An isolation device, comprising:
a pre-metal dielectric (PMD) layer disposed over a substrate;

a first metal level disposed over the PMD layer;
a dielectric layer disposed over the first metal layer;
a second metal level disposed over the dielectric layer;
a polymer dielectric layer disposed over the second metal level, the polymer dielectric layer comprising primarily a layer of polymer selected from the group consisting of polyimide and poly(p-phenylene-2,6-benzobisoxazole) (PBO), said polymer being at least 20 microns thick;
a third metal level disposed over said polymer dielectric layer, said third metal level extending into upper via holes in said polymer dielectric layer to form upper vias which make electrical connections to said second metal level;
bondpads disposed over said third metal level; and
a dielectric overcoat dielectric layer disposed over said third metal level, said dielectric overcoat dielectric layer exposing said bondpads;
said isolation device containing a plurality of isolation components selected from the group consisting of a capacitor and a transformer, said isolation components being formed in at least said second metal level and said third metal level.

2. The isolation device of claim 1, wherein:
each instance of said isolation components is a capacitor;
a lower plate of said capacitor is provided in said second metal level;
an upper plate of said capacitor is provided in said third metal level;
said lower plate is electrically coupled to a first instance of said bondpads through an instance of said upper vias;
said upper plate is electrically coupled to a second instance of said bondpads.

3. The isolation device of claim 2, wherein said dielectric layer is at least 5 microns thick.

4. The isolation device of claim 1, wherein:
each instance of said isolation components is a transformer;
a lower winding of said transformer is provided in said second metal level;
an upper winding of said transformer is provided in said third metal level;
said lower winding is electrically coupled to a first two instances of said bondpads through instances of said upper vias;
said upper plate is electrically coupled to a second two instances of said bondpads.

5. The isolation device of claim 1, in which said second metal layer has a sheet resistance less than 10 milliohms/square, and said third metal layer has a sheet resistance less than 10 milliohms/square.

6. The isolation device of claim 1, in which said layer of polymer in said polymer dielectric layer is polyimide.

7. The isolation device of claim 1, in which said layer of polymer in said polymer dielectric layer is PBO.

8. The isolation device of claim 1, in which each of said isolation components is operable to 400 volts continuous operation, and able to withstand a voltage transient up to 5000 root-mean-square (rms) volts and a voltage surge up 10000 volts.

9. The isolation device of claim 1, in which said substrate is single crystal silicon.

10. The isolation device of claim 1, in which said second metal level includes a layer of copper 4 to 6 microns thick, and said third metal level includes a layer of copper 4 to 6 microns thick.

* * * * *